United States Patent [19]
Emoto et al.

[11] Patent Number: 4,746,967
[45] Date of Patent: May 24, 1988

[54] SEMICONDUCTOR DEVICE

[75] Inventors: Takao Emoto, Yokosuka; Takeo Shiomi, Kawasaki, both of Japan

[73] Assignee: Kabushiki Kaisha Toshiba, Kawasaki, Japan

[21] Appl. No.: 47,598

[22] Filed: May 11, 1987

Related U.S. Application Data

[63] Continuation of Ser. No. 774,718, Sep. 11, 1985, abandoned.

[30] Foreign Application Priority Data

Sep. 25, 1984 [JP] Japan .................... 59-200106

[51] Int. Cl.$^4$ ............................................. H01L 29/06
[52] U.S. Cl. ........................................ 357/88; 357/13;
357/20; 357/34; 357/37; 357/51; 357/55
[58] Field of Search ................. 357/13, 20, 34, 37, 357/51, 55, 88

[56] References Cited

U.S. PATENT DOCUMENTS 4,412,378  11/1983  Shinada ................................. 357/34
4,452,645  6/1984  Chu et al. ............................. 357/34

FOREIGN PATENT DOCUMENTS 0061551  9/1982  European Pat. Off. .
0061063  8/1983  European Pat. Off. .

OTHER PUBLICATIONS

Jan W. Slotboom, "Computer-Aided Two-Dimensional Analysis of Bipolar Transistors", IEEE Transactions on Electron Devices, vol. Ed-20, No. 8, pp. 669-679, Aug. 1973.

Primary Examiner—Edward J. Wojciechowicz
Attorney, Agent, or Firm—Oblon, Fisher, Spivak, McClelland & Maier

[57] ABSTRACT

This invention relates to high breakdown voltage semiconductor devices and consists in a semiconductor device formed with a highly doped impurity region of the same conductive type as the semiconductor substrate, wherein the highly doped impurity region projects by a prescribed amount opposite a first impurity region and is formed at the back face of the semiconductor substrate, its projecting width T being in the same position as the middle of the first impurity region and being such as to satisfy $t1 \lesssim T \lesssim t1 + 2W0$, where $t1$ is the width of the first impurity region, and $W0$ is the separtion in the depth direction between the first impurity region and the highly doped impurity region.

6 Claims, 7 Drawing Sheets

SEMICONDUCTOR DEVICE

This application is a continuation of application Ser. No. 774,718, filed on Sept. 11, 1985, now abandoned.

BACKGROUND OF THE INVENTION (1) Field of the Invention

This invention relates to semiconductor devices. It is particularly concerned with high breakdown voltage semiconductor devices.

Specifically, it relates to a semiconductor device having an improved breakdown voltage achieved by preventing excessive electric field concentrations at high curvature portions of the main junctions.

(2) Description of the Prior Art

Semiconductor devices with a high breakdown voltage were conventionally obtained by utilizing what is known as a mesa structure or a planar structure having a guard ring. The first structure has the advantage that (if the device is a diode) the PN junction, or (if the device is a transistor) the junction between base and collector are flat, so electric field concentrations do not occur. It is therefore widely used for semiconductor devices of high breakdown voltage.

However, with a mesa type structure, not only is it necessary to form a mesa to obtain the high breakdown voltage, but in addition the mesa has to be covered with a protective material. This complicates the manufacturing process. Semiconductor devices of planar structure having a guard ring are therefore often used, because they can be easily obtained by a simple manufacturing process. However, also in the case of planar semiconductor devices with a guard ring, if high breakdown voltages (1 KV or more, for example) are to be obtained, as many guard ring regions must be formed as possible, so as to raise the breakdown voltage by reducing the electric field concentration at the portions of high curvature of the PN junction (in the case of a diode) or the base-collector junction (in the case of a transistor). This made it difficult to reduce the element size.

Moreover, particularly with recent progress in CVD techniques, forming high-resistance materials such as polysilicon has become easier, and the so-called "resistive field plate" method has attracted attention, in which a high-resistance layer is provided on top of a dielectric arranged on the peripheral surface of a PN junction. Compared with use of a guard ring, this resistive field plate method has the advantages that only a comparatively small area is needed, the breakdown voltage dependence on junction depth is small and it is not so dependent on the accuracy of the transverse spread of the junction as the guard ring method is on the accuracy of the separation from the guard ring junction. However, neither this method nor the guard ring method enable electric field concentrations at curved portions of the PN junction to be relieved as effectively as they can be with the mesa structure.

U.S. Pat. No. 3,717,515 discloses a method for fabricating a monolithic integrated circuit including at least one pedestal transistor device in order to enable the formation of transistor devices having smaller dimensions than previously without sacrificing high frequency switching performance.

SUMMARY OF THE INVENTION

The object of this invention is to provide a semiconductor device wherein an improved breakdown voltage is achieved by reducing to a great extent electric field concentrations at high curvature regions of PN junctions (in the case of diodes) or between the base and collector (in the case of transistors).

This invention relates to high breakdown voltage semiconductor devices and consists in a semiconductor device formed with a highly doped impurity region of the same conductivity type as the semiconductor substrate, wherein the highly doped impurity region projects by a prescribed amount opposite a first impurity region and is formed at the back face of the semiconductor substrate, being such as to satisfy $t1 \lesssim T \lesssim t1+2W0$, where $t1$ is the width of the first impurity region, and $W0$ is the separation between the first impurity region and the highly doped impurity region: whereby an improved breakdown voltage is achieved by reducing to a great extent electric field concentrations at high curvature regions of the PN junction.

BRIEF DESCRIPTION OF THE DRAWINGS

The exact nature of this invention, as well as other objects and advantages thereof, will be readily apparent from consideration of the following specification relating to an annexed drawing in which.

BRIEF DESCRIPTION OF THE PREFERRED EMBODIMENTS

Embodiments of this invention are described below with reference to the drawings.

Figure 1:
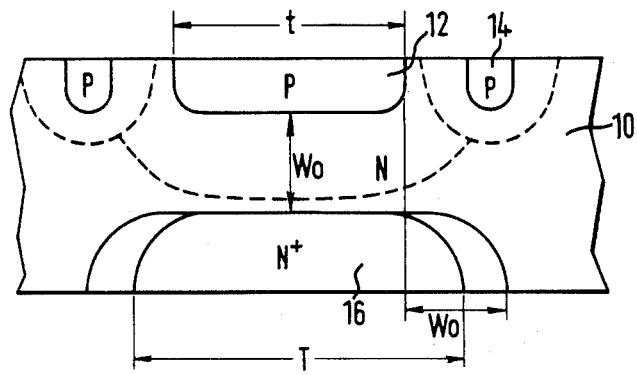
FIG. 1 is a cross-sectional view of a first preferred embodiment of this invention.

FIG. 1 is a cross-sectional view showing a first preferred embodiment of this invention. The case where the semiconductor substrate is an N type diode will be described. As shown in FIG. 1, a doping level of an N type semiconductor substrate 10 is about $10^{13-14}$ (cm$^{-3}$). An anode region 12 of P type conductivity, with surface impurity concentration $10^{19-20}$ (cm$^{-1}$) and constituting a first impurity region is formed in a prescribed region of the main face of the semiconductor substrate. A guard ring region 14 is formed in a prescribed region of the main face of the semiconductor substrate 10 so as to surround the anode region 12. FIG. 1 shows a single guard ring, but two or more guard rings could be used. A resistive field plate structure could also be used. An N+ type highly doped impurity region 16 of surface impurity concentration $10^{20}$ (cm$^{-2}$) is formed facing the anode region 12 on the back face of the semiconductor substrate 10. It is preferred to form the highly doped impurity region 16 such that its middle region is in the same position as the anode region 12. The side face portion of the highly doped impurity region 16 is formed by introducing the impurity up to a position defined by adding a dimension W0, or rather less than this, to the width of the anode region 12. This dimension W0 is the separation in the depth direction between the anode region and highly doped impurity region.

Figure 2:
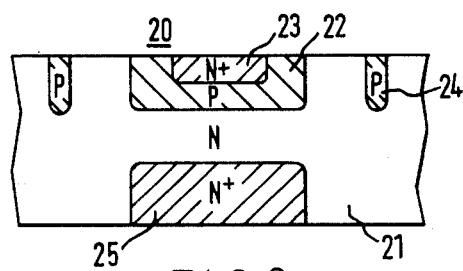
FIG. 2 is a cross-sectional view of a second preferred embodiment of this invention.

A description will now be given for the case of the NPN transistor of breakdown voltage 1500 (V) and maximum collector current 3.5 (A) shown in FIG. 2. The substrate of the transistor of FIG. 2 is an N-type semiconductor substrate of doping concentration $10^{13-14}$ (cm$^{-1}$), and of thickness for example 300 (micron). A base region 22 of P-type conductivity of surface impurity concentration $10^{18-19}$ (cm$^{-3}$), constituting a first impurity region, is formed in a prescribed region of the main face of the semiconductor substrate 21. The diffusion depth of this region is for example 50 (micron). An N+ conductivity type emitter region 23 of surface impurity concentration $10^{21}$ (cm$^{-3}$), of prescribed depth of diffusion and constituting a second impurity region, is formed within the base region 22. A guard ring region 24 is formed in a prescribed region of the main face of the semiconductor substrate 21 so as to surround the base region 22, leaving a prescribed separation. FIG. 2 shows a single guard ring, but two or more could be provided. An N+ type highly doped impurity region 25 of surface impurity concentration $10^{20}$ (cm$^{-3}$) is formed on the back face of the semiconductor substrate 21 opposite to, and with its center in the same position as, the base region 22. However, it is not essential for the centers of these regions to be in the same position; suitable modifications can be made in accordance with design requirements. The diffusion depth of this region is for example 150 (micron). The side face of the highly doped impurity region 25 is formed so as to be positioned at a location specified from the width of the emitter region by adding a dimension W0, which dimension is the separation in the depth direction between this base region and the highly doped impurity region, to the width of the base region 22.

Figure 3:
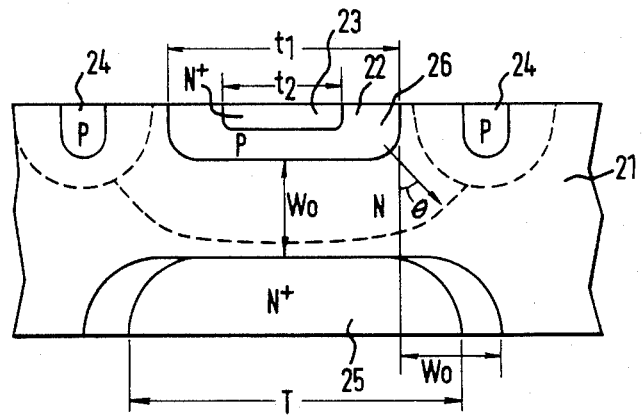
FIG. 3 is a cross-section showing the position where the highly doped impurity region of this invention is formed.

FIG. 3 is a cross-sectional view given to explain how the position of formation of the highly doped impurity region of this invention is specified. Portions which are the same as in FIG. are given the same reference numerals. As shown in FIG. 3, the projection width T of the highly doped impurity region 25 is formed so as to satisfy $t2 < T \lesssim t1 + 2W0$ and with its center in the same position as the center of the base region; t2 is the width of the second impurity region; T is the projection width of the highly doped impurity region; and W0 is the separation in the depth direction between the first impurity region and the highly doped impurity region.

Figure 4:
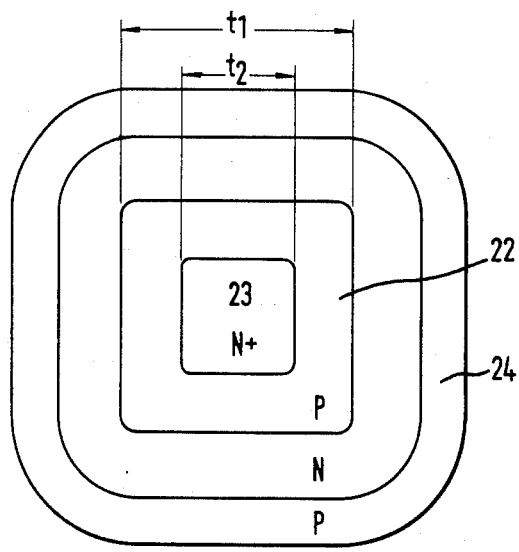
FIG. 4 is a plan view corresponding to FIG. 3 seen from the side of the main face.

FIG. 4 is a plan view seen from the main face of FIG. 3. As shown in FIG. 4, the width of the various regions described above represents the spread of the diffusion region on the surface of the semiconductor substrate. This also applies to the collector region.

Figure 5:
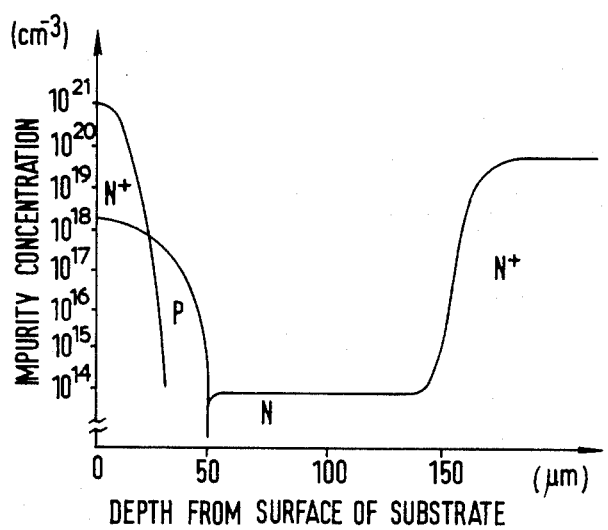
FIG. 5 is a doping concentration profile of the various impurity regions of the cross-section shown in FIG. 2.

FIG. 5 shows the doping profile of the various regions with depth from the semiconductor surface. The reason why the projection width T of the highly doped impurity region 25 of the semiconductor device of this invention is chosen within the range $t2 < T \lesssim t1 + 2W0$ is as follows. In the semiconductor device shown in this invention in order to make the internal resistance of the collector small, the projection width T of the highly doped impurity region 25 should be made large. However, to increase the breakdown voltage of the semiconductor device, the projection width T should be small. However, the main factor that determines this breakdown voltage is the electric field concentration due to the depletion layer extending from the base region 22. This electric field concentration is most marked in curved regions of the main junction (boundary region between the base region 22 and collector region 21). In general if the diffusion depth of the base region is about 40 to 50 (micron), the electric field concentration is most marked in the approximately $\theta = 45°$ direction of the curved portion 6, but, even if the diffusion depth is not so great as this, electric field concentration at curved portions is believed to occur to about the same degree, not being much affected by small changes in the vertical direction. The extension of the depletion layer increases with increased applied voltage. That is, the breakdown voltage is adversely affected if the width T of the region 25 is made greater, for the width t1 of the base region 22, than the separation W0 of the base region and the highly doped impurity region 25.

In contrast, if, with the aim of increasing the breakdown voltage, the projection width T of the region 25 is made less than the width t2 of the emitter region 23, sufficient collector current cannot be obtained, since the internal resistance of the device becomes large. The projecting portion should therefore desirably be in the range of $\theta = 45°$ of the emitter junction. In other words, sufficient collector current can be obtained if the projection width T of the region 25 is made to satisfy the inequality:

$$t2 < T \lesssim t1 + 2W0.$$

Furthermore, satisfactory reduction of electric field concentrations at curved portions of the base-collector junction formed between the base region 22 and collector region 21 can also be obtained, and the breakdown voltage increased. Additionally, the highly doped impurity region 25 is easy to form, and enables elements of small size to be produced since only the minimum necessary number of guard rings need to be formed.

In the above description, the projection width T of the highly doped impurity region 25 has been chosen within the range: $t2 < T \lesssim t1 + 2W0$. However, if, depending on the requirements imposed on the semiconductor device, the internal resistance of the collector has to be made small, it can be chose such that:

$$t1 \lesssim T \lesssim t1 + 2W0.$$

Figure 6:
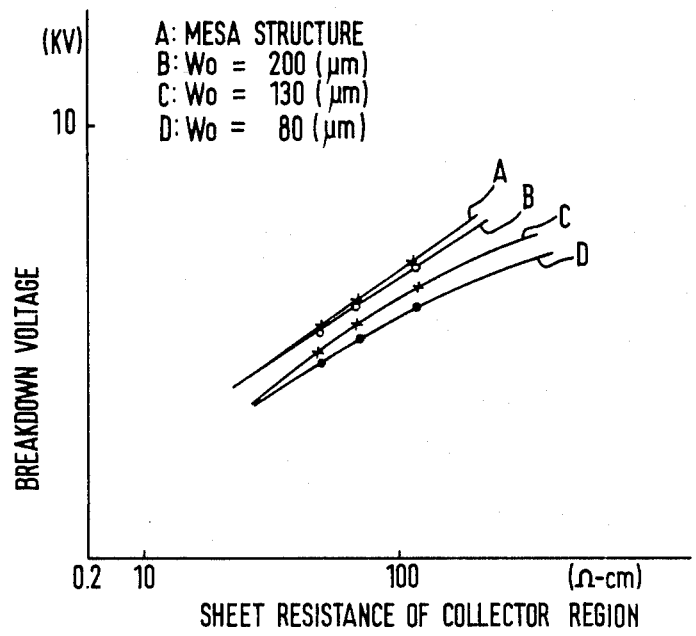
FIG. 6 is a characteristic showing the relationship between the breakdown voltage and the sheet resistance of the collector region, taking the separation Wo between the first impurity region and the highly doped impurity region (in the case of a flat junction) as a parameter.

The reason why the breakdown voltage can be increased by the formation of such a highly doped impurity region 25 can easily be understood from the characteristics (A ... D) of the relationship, shown in FIG. 6, between the breakdown voltage and the collector region sheet resistance. In this Figure, the characteristic A corresponds to the variation of the breakdown voltage of a semiconductor device [diffusion depth Xj of the base region = 50 (microns)] which is essentially of mesa structure. Characteristics B to D show the variation in breakdown voltage in the case of a semiconductor device of guard ring planar structure with a highly doped impurity region with a flat junction. In the case of characteristic B, the separation between the highly doped impurity region 25 and the base region 22 is 200 micron; in the case of characteristic C, the separation between the highly doped impurity region 25 and the base region 22 is 130 micron; in the case of characteristic D, the separation between the highly doped impurity region 25 and the base region 22 is 80 (micron).

Figure 7:
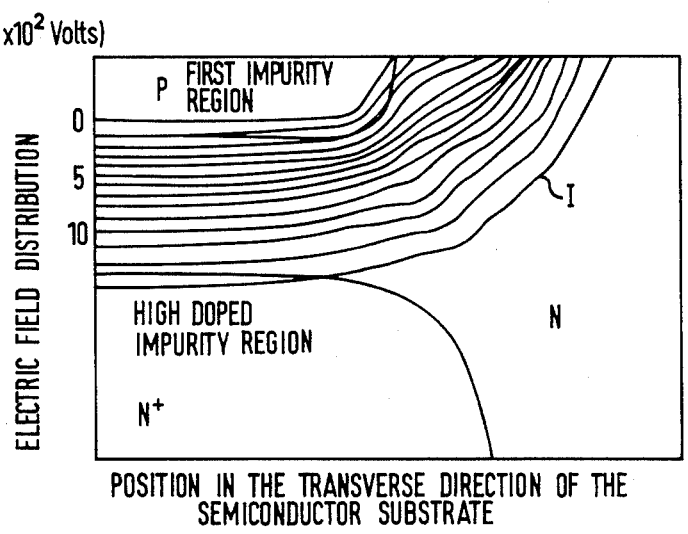
FIG. 7 is a characteristic of the relationship between the electric field distribution of this invention and position in the transverse direction of the semiconductor substrate.

Consequently, since, in the case of the semiconductor devices to which this invention relates, there are very marked concentrations of electric field at the curved portions of the PN junction in the case of a diode or the base-collector junction in the case of a transistor, the breakdown voltage is increased for increased separation, in the depth direction, at these portions i.e. between the highly doped impurity region and the anode region or base region. In other words, as is clear from the electric field concentration curve I of FIG. 7, the breakdown voltage can be substantially raised by making the separation between the anode region or base region and highly doped impurity region directly below the anode region or base region and guard ring region, which have the largest effect on the breakdown voltage, as large as possible (subject to considerations regarding increase in the resistance of the cathode region or collector region). In the case of the breakdown voltage of 1500 (V) shown in the embodiment of FIG. 2, this separation W0 may be taken as 100 (micron).

Figure 8:
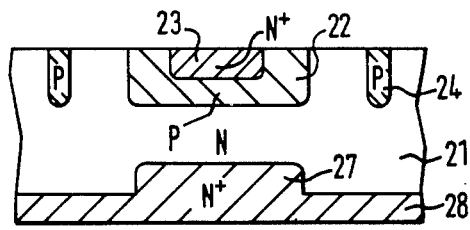
FIG. 8 is a cross-sectional view showing a third preferred embodiment of this invention.

A third embodiment will now be described, with reference to FIG. 8. The third embodiment is a structure in which a highly doped impurity region 28 is formed that is shallower than the projection 27 in the second embodiment. The effect of this invention can be satisfactorily obtained with this third embodiment also. Furthermore, since the highly doped impurity region 28 is shallow, there is the advantage that more current can flow since the internal resistance is less than in the case of the second embodiment.

Figure 9:
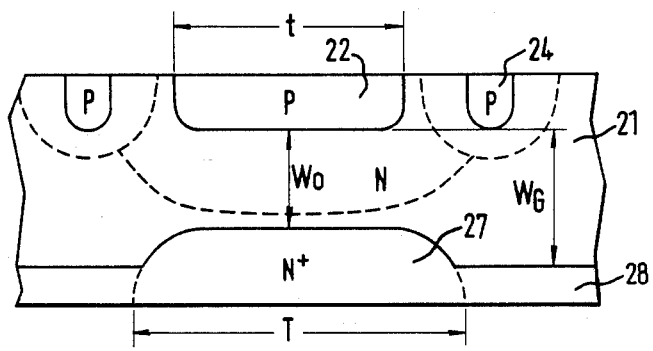
FIG. 9 is a cross-sectional view given in explanation of the third embodiment, shown in FIG. 8.

FIG. 9 is a cross-sectional view given in explanation of the third embodiment. The device is formed such that $W0 < Wg$, where the separation between the first impurity region 22 and the highly doped impurity region 28 is taken as Wg. The separation Wg is determined by the extension of the depletion layer from the first impurity region 22.

Figure 10:
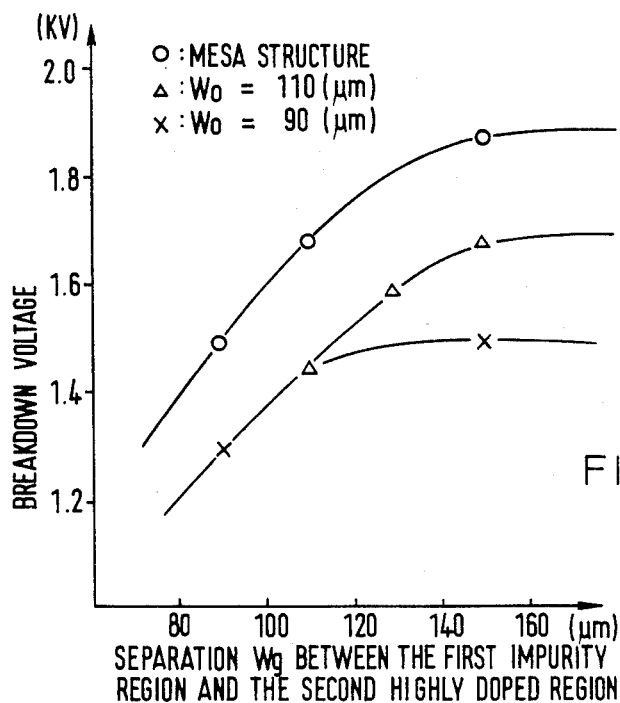
FIG. 10 is a view showing the relationship between the separation Wg between the first impurity region and the lightly doped impurity region and the breakdown voltage.

FIG. 10 is a view showing the relationship between the breakdown voltage and the separation Wg when the specific resistance $\rho p$ of the first impurity region 22 is 0.06 ($\Omega$-cm), and the specific resistance $\rho n$ of the semiconductor substrate 21 is 60 ($\Omega$-cm). In FIG. 10, the values in the case of a conventional mesa construction are shown for purposes of comparison. The symbol 0 in FIG. 10 indicates the mesa structure, while the symbol $\Delta$ indicates the case where the separation Wo is 110 (micron) and the symbol X the case where the separation Wo is 90 (micron). A breakdown voltage of 1.7 (KV) can be obtained when the separation Wo is 110 (micron) and the separation Wg is 150 (micron). This corresponds to the case where the thickness tn of the collector region of the mesa structure is 110 (micron).

Figure 11:
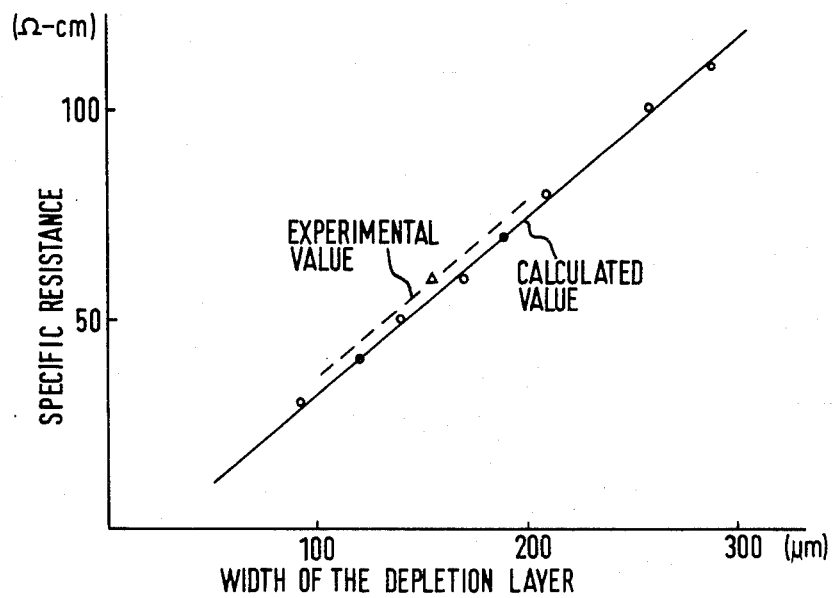
FIG. 11 is a view showing the relationship between the specific resistance and the width of the depletion layer.

In FIG. 11, the specific resistance $\rho n$ ($\Omega$-cm) of the semiconductor substrate 1 is taken along the vertical axis, while the width of the depletion layer when a reverse bias voltage is applied is taken along the horizontal axis. In FIG. 11, the width of the depletion layer when $\rho n$ is 60 ($\Omega$-cm) is about 150 (micron). This invention is therefore effective when setting the separation Wg between the first impurity region and the shallow highly doped impurity region shown in FIG. 10 such that the width of this depletion layer is not exceeded for each respective $\rho n$.

This embodiment has been described with reference to a transistor, but clearly it could be applied to a diode as in the first embodiment.

Figure 12:
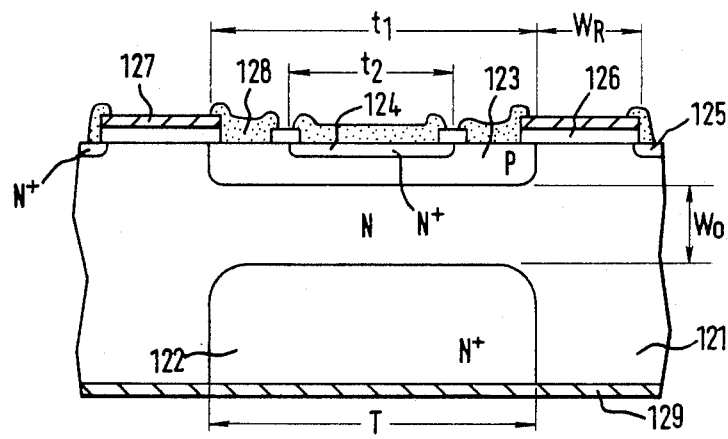
FIG. 12 is a cross-sectional view showing a fourth embodiment of this invention.

Also, though the above description had been given with reference to a planar construction having a guard ring, the invention is not restricted to this and could also be applied to the resistive field plate construction shown in FIG. 12.

Figure 13:
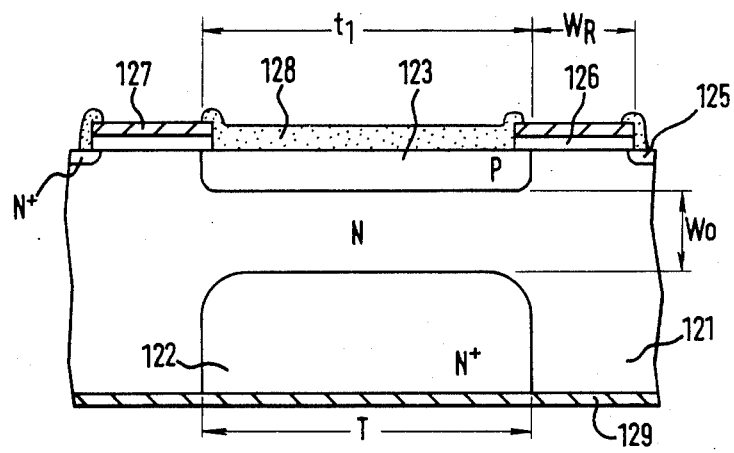
FIG. 13 is a cross-sectional view showing a fifth embodiment of this invention.

FIG. 12 is a cross-section showing an embodiment of this invention applied to the case of a power transistor employing a resistive field plate configuration. FIG. 13 is a cross-section for the case of a diode. Since the effect of these embodiments is the same, for this embodiment we shall describe as an example the case of a power transistor.

In FIG. 12, a silicon dioxide layer of thickness 3 microns is formed by heat treatment in a steam atmosphere of for example an N-type substrate. If the thickness of this SiO2 layer is insufficient, a further layer of SiO2 or Si3N4 etc. may be deposited by the CVD method. Next this silicon dioxide layer is partially removed by photolithography, and phosphorus atoms are diffused into it to form an N+ highly doped impurity projecting portion 122. The main face is formed by mechanically lapping the opposite face of the sustrate by a prescribed amount, leaving a high resistance layer 121.

The main face of this N type high resistance layer 121 is then again subjected to heat treatment in a steam atmosphere, to form a SiO2 layer of thickness 1.5 (micron). This SiO2 layer is then partially removed by once more carrying out photolithography. Boron atoms are then diffused into it to form a p-type base layer 123 (Xb = 10 micron). The central position of this base layer 123 corresponds to the center position of the N+ highly doped impurity projecting portion. An N+ type emitter layer 124 (Xe = 5 micron) and N+ layer 125 are then formed in the same way. Next, a resistive field plate layer 127 is provided. The main face is then provided with an Al electrode 128 and the back face with a Ni or the like electrode 129 to complete the transistor.

In a semiconductor device having such a construction, the relationship between the width (t2) of the N+ type emitter layer 124 is the p type base layer 123, and the width (T) of the N+ type highly doped impurity region 122 is specified by $t2 < T \lesssim t1 + 2W0$ (in the case of separation (W0) in the depth direction of the high resistance layer 121). Or, for a diode, in the case of the width (t1) of the p type anode layer 123, is set such that $t1 \lesssim T \lesssim t1 + 2W0$.

Figure 15:
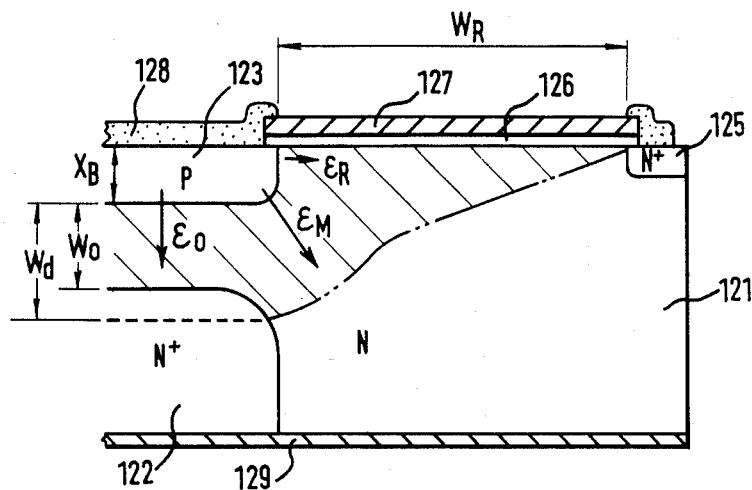
FIG. 15 is a cross-sectional view given in explanation of the fifth embodiment of this invention, shown in FIG. 13.

The spread of the depletion layer into the N type resistance layer 121 is shown in FIG. 15 for the case when a reverse bias voltage V is applied to the PN junction for an internal field model of a semiconductor device, for example. In this Figure, the electric field represented by the vector ($\epsilon O$, $\epsilon M$, $\epsilon R$) is clearly a maximum. There is a substantial improvement in the breakdown voltage under the conditions approximately represented by $W0 < Wd$ since the structure is such that the electric field ($\epsilon M$) at the curved portion of the PN junction is not impeded by the N+ type highly doped impurity region 122. In this inequality, Wd is the width of the depletion layer shown in FIG. 15. As shown in FIG. 11, the width of the depletion layer is altered by the resistance of the semiconductor substrate.

Figure 16:
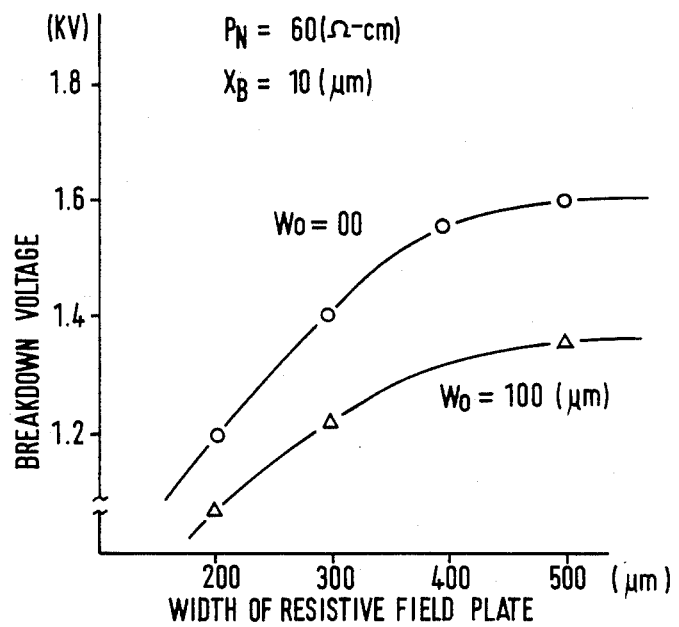
FIG. 16 is a view showing the relationship between the width of the resistive field plate layer and the breakdown voltage.

FIG. 16 gives the data for a conventional device which is not provided with a projecting N+ type highly doped impuritry region. When Wo=∞, the breakdown voltage of the flat junction is VB=1.6 (KV), and when Wo=100 (micron), it is VB=1.4 (KV). Thus, the structure of this invention shifts the breakdown voltage for Wo=100 (micron) onto the level of that for Wo=∞. The effectiveness of this invention has in fact been ascertained in enabling a breakdown voltage of about VB=1.5 (KV) to be obtained for WR=350 (micron).

The situations $t2 < T$ and $t1 \lesssim T$ are determined from the current characteristic. The above conditions are found, in the case of a transistor, by consideration of the spreading resistance in a collector layer of emitter layer width (t1), and, in the case of diode, by consideration of the spreading resistance in a cathode layer of p-type anode width (t1).

Figure 14:
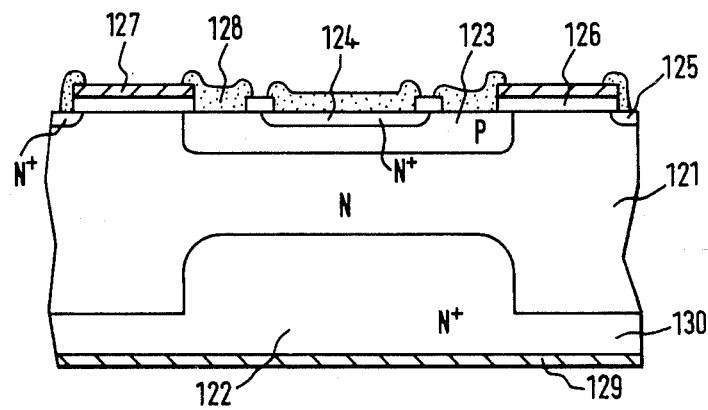
FIG. 14 is a cross-sectional view showing a sixth embodiment of this invention.

FIG. 14 is a cross-sectional view showing a sixth embodiment of this invention. The embodiment of FIG. 14 is an embodiment in which a highly doped impurity region 130 is formed, which is shallower than the projecting portion 122 in the fourth embodiment shown in FIG. 12. This corresponds to the embodiment shown in FIG. 8. Because this highly doped impurity region 130 is shallow, the internal resistance can be made smaller than in the case of the fourth embodiment. This gives the advantage that the current can be made larger.

As explained above, with a semiconductor device according to this invention, the breakdown voltage can be increased since the electric field concentration at curved portions of the junctions (PN junction in the case of a diode and base-collector junction in the case of a transistor) can be reduced.

What we claim is:

1. A semiconductor device comprising:
   a semiconductor substrate of a first conductivity type, said substrate having opposed sides;
   a first impurity region of a second conductivity type formed in one side of said semiconductor substrate, said first impurity region and said substrate forming a PN junction therebetween, said PN junction having a curved portion such that said PN junction extends from a predetermined depth of said substrate to said one side of said substrate;
   a first highly doped impurity region of the first conductivity type formed in the other side of said semiconductor substrate opposite said first impurity region and satisfying:

$$t1 \lesssim T \lesssim t1 + 2W0,$$

where t1 is the width of the first impurity region,
   T is the width of the first highly doped impurity region, and
   W0 is the separation, in the depth direction, between said first impurity region and said first highly doped impurity region.

2. The semiconductor device as in claim 1, further including:
   a second highly doped impurity region of the first conductivity type formed adjacent said first highly doped impurity region in the other side of said semiconductor substrate and formed to be shallower than said first highly doped impurity region.

3. The semiconductor device of claim 1, wherein said first highly doped impurity region has a centerline coincident with that of said first impurity region.

4. The semiconductor device as in claim 3, further including:
   a second highly doped impurity region of the first conductivity type formed adjacent said first highly doped impurity region in the other side of said semiconductor substrate and formed to be shallower than said first highly doped impurity region.

5. The semiconductor device as in claim 1 further including:
   a guard ring region of the second conductivity type is formed surrounding said first impurity region.

6. The semiconductor device as in claim 1, further including:
   a resistive field plate formed so as to surround said first impurity region.

* * * * *